(12) United States Patent
Obermaier

(10) Patent No.: US 6,656,314 B2
(45) Date of Patent: Dec. 2, 2003

(54) METHOD OF MANUFACTURING MULTILAYER SUBSTRATES

(75) Inventor: Hannsjorg Obermaier, Los Gatos, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 174 days.

(21) Appl. No.: 09/862,705

(22) Filed: May 23, 2001

(65) Prior Publication Data

US 2002/0176961 A1 Nov. 28, 2002

(51) Int. Cl.[7] .............................. B32B 3/10; B32B 31/00
(52) U.S. Cl. ................... 156/272.8; 156/89.16; 156/289; 29/847; 29/830
(58) Field of Search .................. 156/273.3, 275.7, 156/272.8, 289, 306.9, 307.1, 156, 89.12, 89.16, 89.17; 29/847, 829, 830; 174/250, 255

(56) References Cited

U.S. PATENT DOCUMENTS

| | | | | |
|---|---|---|---|---|
| 4,737,446 A | * | 4/1988 | Cohen et al. | 430/311 |
| 4,755,911 A | * | 7/1988 | Suzuki | 361/414 |
| 5,137,618 A | * | 8/1992 | Burnett et al. | 205/125 |
| 5,260,170 A | * | 11/1993 | Brown | 430/315 |
| 5,334,488 A | * | 8/1994 | Shipley, Jr. | 430/215 |
| 5,362,534 A | * | 11/1994 | McKenney et al. | 428/40 |
| 5,666,722 A | | 9/1997 | Tamm et al. | 29/847 |
| 6,103,977 A | * | 8/2000 | Namgung | 174/255 |

FOREIGN PATENT DOCUMENTS

EP    0 677 985    5/1999    ............ H05K/3/04

* cited by examiner

*Primary Examiner*—Michael W. Ball
*Assistant Examiner*—Todd J. Kilkenny

(57) ABSTRACT

A multi-layered substrate is manufactured utilizing a sheet material. The sheet material is a dielectric material with a dielectric adhesive coated on one side. A catalyst layer is at a boundary between the dielectric material and the adhesive. The catalyst layer is thin in comparison to the dielectric material and the dielectric adhesive. In the manufacture of the multi-layered substrate, the material is processed using patterning and metallizing steps. During this manufacture the processed sheet material may be supported with a releasable layer. Laminating additional sheet materials onto previously processed sheets produces multiple layers. These additional sheets are then processed. Multiple lamination steps may be performed in order to obtain an end product of a desired number of layers.

14 Claims, 14 Drawing Sheets

METHOD 400

METHOD OF MANUFACTURING MULTILAYER SUBSTRATES

FIELD OF THE INVENTION

The invention generally relates to a manufacturing process for producing circuit board substrates, and more particularly to the process of patterning, metallizing, and layering dielectric materials according to a desired number of layers.

BACKGROUND OF THE INVENTION

Multi-layered printed circuit board substrates are well known. These substrates utilize plural stacked circuit boards with additional layers of dielectric materials that separate conductors. The multi-layer substrates usually incorporate interconnections extending between the conductors on the various layers in the stack, in order to provide the necessary electrical interconnections. Electrical interconnections between conductors in the various layers of multi-layered PCBs are accomplished through vias.

The production of these multi-layered substrates usually involves the use of catalysts to assist with interlayer formation. Known methods of production utilize bulk dielectric materials, which include catalysts dispersed therein. A problem with the inclusion of the catalyst in the dielectric is that the quality of the dielectric is compromised. This makes the resulting substrate less desirable for high frequency applications because of magnetic interference and other disturbances. In other words, the inclusion of the catalyst in the dielectric is detrimental to the electrical performance. Furthermore, the process is expensive.

One known method that includes a dispersion of catalyst in the bulk dielectric is the additive process. This process involves, first, providing the raw material, usually a casting or extrusion of dielectrics or impregnation of fiber reinforcement with dielectric resins that contain a catalyst. Second, patterning of the internal conductors. This involves the application of permanent photosensitive resist, then exposure to actinic light followed by the development of the resist, and then electroless deposition of a metal. Third is a multi-layering process. Several patterned internal layers are stacked. These layers are interleaved with an adhesive. The layers are pressure and heat laminated. Fourth, a via is formed between the layers. This is accomplished by drilling, punching, or ablating the dielectric to form the via followed by electroless deposition of a metal. Fifth, the exterior conductors are patterned.

A problem with this process is that the conductors are formed using photosensitive resist. Also, as stated above, the bulk of the dielectric contains a dispersion of a catalyst and this makes the substrate electrically inferior to similar non-catalyzed resins. This process is also more expensive than processes using non-catalyzed resins.

A recent method of manufacturing a multi-layered substrate that avoids these problems is outlined in EP 677,985 A1. This process includes: First, providing a casting or extrusion of any un-reinforced dielectric that is suitable for ablation to form internal layers. This dielectric is called a raw sheet. Second, a multi step laser ablation of the dielectric follows in order to form conductor and pad cavities on both sides of the dielectric. This step is followed by more laser ablation to form the vias. The third step is the metallization of the internal layers. This is achieved by sputtering a thin layer of metal on the entire surface of the dielectric substrate followed by the deposit of an additional metal layer to achieve the desired thickness in the cavities. Fourth, excess metal is then removed from outside the conductor pattern area by a grinding or polishing process. Fifth, the next step is a multi-layering process. Another raw sheet is laminated over the patterned internal layer with heat and pressure followed by steps 2 through 4 until all layers have been processed.

While the method of EP 677,985 A1 is an important advance, it has several disadvantages. First, excess metal is deposited in areas that do not require metal for the functioning of the substrate, i.e., outside the conductor pattern area. Also, the process of sputtering or electroless deposition followed by a bulk metal deposition and selective removal is much more complex and difficult than one time deposition of metal only where its needed. Furthermore, the process is more expensive than the one time deposition of metal.

SUMMARY OF THE INVENTION

In one respect, the invention is a material for the manufacture of a multi-layered substrate. The material comprises a dielectric material and a dielectric adhesive coated on one side of the dielectric material. The material also comprises a catalyst layer at the boundary between the dielectric material and the dielectric adhesive. Also, the catalyst layer is thin in comparison to the dielectric material and the dielectric adhesive.

In another respect, the invention is a substrate comprising at least one processed material. Each processed material contains metal pad cavities and vias. Also, each processed material comprises, a first dielectric material, a second dielectric material, and, a catalyst layer. The first dielectric material is above the second dielectric material in a layered arrangement. The processed material according to this invention includes a catalyst layer at a boundary between the first dielectric material and the second dielectric material. Also, the catalyst layer is thin in comparison to the first dielectric material and the second dielectric material.

In another respect, the invention is a method for manufacturing a multi-layered substrate. This method includes the step of forming a first material. The first material is formed by, providing a dielectric material and then providing a layer of catalyst on one side of the dielectric material. Also, a dielectric adhesive is coated on the catalyst layer. According to this invention, the catalyst layer is thin in comparison to the dielectric material and the dielectric adhesive.

In this respect the method for manufacturing a multi-layered substrate optionally includes further steps. The method may include the step of patterning a first internal layer by forming conductor cavities in the first material. The method may also include metallizing the first internal layer, so as to form a pad. A subsequent internal layer on the first internal layer is formed, this done while supporting the bottom side of the first internal layer with a protective temporary release layer. This method may also include the steps of patterning the subsequent internal layer and metallizing the subsequent internal layer. According to this method, additional layers may be formed by repeating the following steps as often as required: the forming of a subsequent layer step; the patterning step; and the metallization step. This method may also include the removing of the temporary release material from the bottom side of the first internal layer, and a further patterning of the bottom side of the first internal layer so as to form a bottom cavity.

In another respect, the method for manufacturing a multi-layered substrate optionally includes further steps. The method may also include the step of providing a first material, as outlined above. The method according to this invention may include further steps. The method may include the step of preparing a starting layer by providing a temporary release layer. This involves laminating the first material to the temporary support. The method may also include the patterning of a first internal layer and metallizing the first internal layer. According to this method, additional layers may be formed by laminating an additional material to the first material. The additional material is substantially similar to the first processed material. This method may also include the repetition of the steps of patterning and metallizing as many times as required, and the step of finishing the temporary support release layer.

In comparison to known prior art, certain embodiments of the invention are capable of achieving certain advantages. One possible advantage is the simplicity of the method for producing a less expensive and electrically superior multi-layered substrate. Another possible advantage is the use of a more desirable dielectric that does not have any catalyst dispersed therein. Additionally, very little of the expensive catalyst is required for the thin layer between the dielectric and adhesive of the raw sheet. Furthermore, the thin layer of catalyst has minimal adverse effects on the electrical properties of the dielectric such as dielectric constant, dielectric loss and bulk resistance. Another possible advantage is that only three types of processes are required for a typical substrate, i.e., ablation, electroless metal deposition, and lamination. Another possible advantage is the stepped via design in combination with the correct dielectric and adhesive layer thickness resulting in reliable electrical connections from layer to layer. These and other advantages will be apparent to those skilled in the art upon reading the following detailed description of preferred embodiments, with reference to the below listed drawings.

DETAILED DESCRIPTION OF THE PREFERRED EMBODIMENTS

Figure 1A:
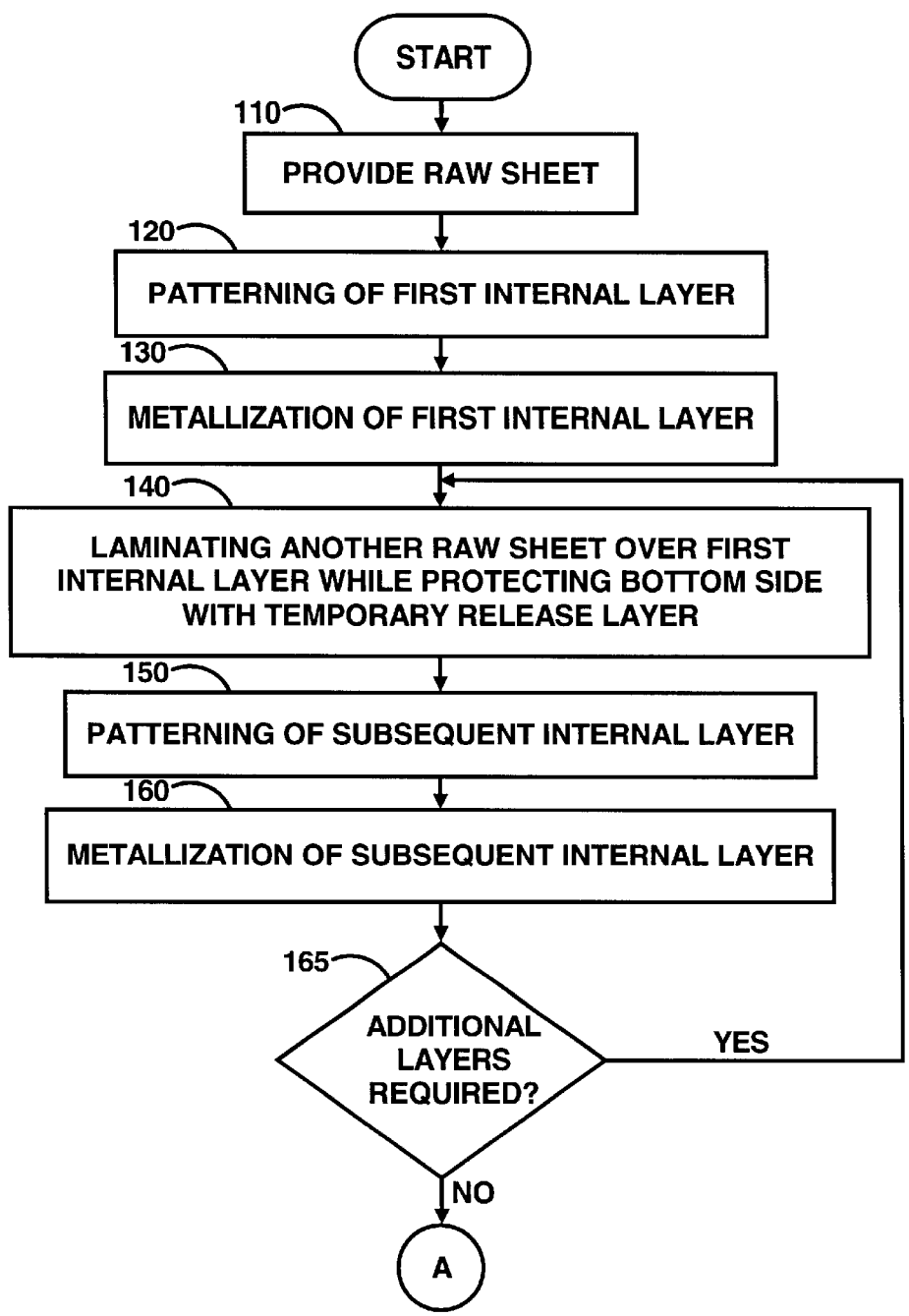
FIGS. 1A and 1B are flow-charts showing the method of manufacturing according to a first embodiment.
Figure 1B:
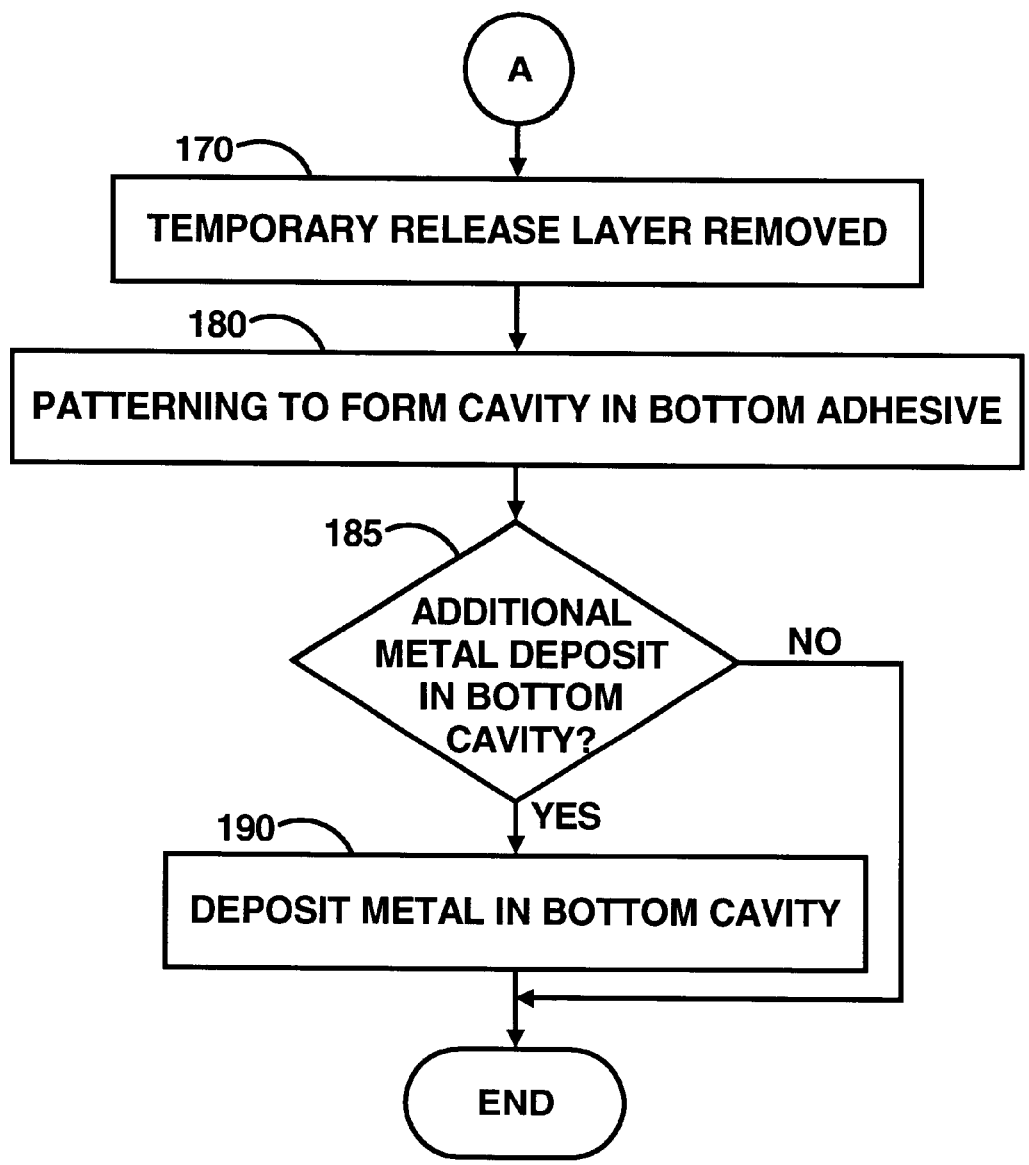

FIGS. 1A and 1B define a flow chart showing the method 100 of manufacturing according to a first embodiment. In the first step 110, the method 100 provides a raw sheet. This is followed by the step of patterning (120) a first internal layer. The following step 130 is the metallizing of the first internal layer. After this metallizing step 130, another raw sheet is laminated (140) over the first internal layer. This step 140 also provides for the protection of the bottom side of the first internal layer with a temporary release layer, which also prevents the laminate from sticking to lamination plates used in the process. Patterning of the subsequent internal layer is next 150. This patterning step 150 is followed by a metallizing step 160 where the subsequent internal layer is metallized. At this stage a decision (165) is made as to whether an additional layer is required. If an additional layer is required, steps 140–165 are repeated, i.e., the laminating of another raw sheet, the patterning of this subsequent layer, the metallizing of this subsequent layer, and the decision stage. It should be noted that when the laminating step 140 is repeated, there is no need to add a temporary release layer because the bottom side is already supported with the original release layer. At the decision stage (165), if it is decided that no additional layer is required, then the temporary release layer is removed (170). Following the removal of this layer, patterning (180) of the bottom adhesive is performed, forming a bottom cavity. The substrate at the end of this patterning step 180 could be the end product. However a decision (185) is made whether to deposit metal in the bottom cavity. If the decision is yes then a further metallizing step 190 is performed, producing the final substrate.

As described above, FIGS. 1A and 1B give a general outline of the method 100 of manufacturing a substrate according to a first embodiment. The individual steps 110–190 are all described therein. FIGS. 2–12 illustrate more comprehensively, the step-by-step results of the method of production according to this method.

Figure 2:
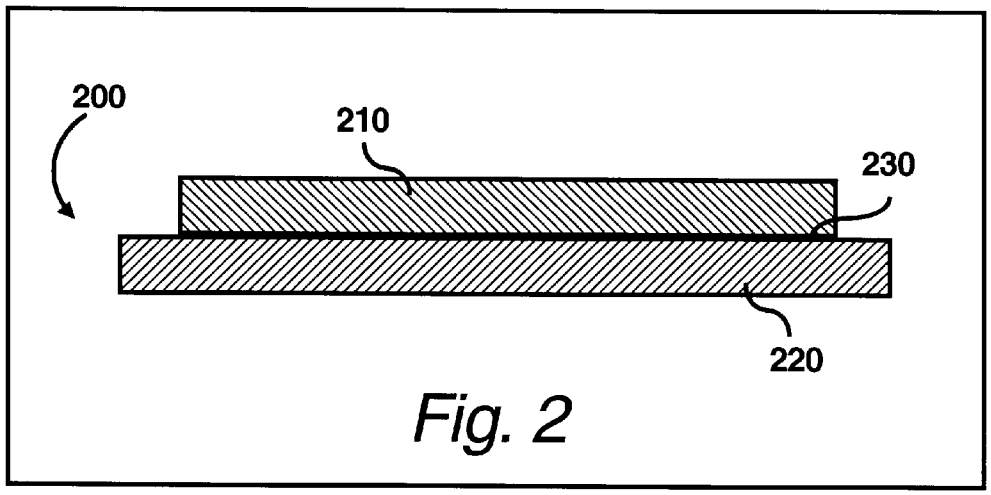
FIG. 2 is a schematic cross section of a raw sheet material according to a first embodiment.

FIG. 2 is a schematic cross section of a raw sheet material according to the first embodiment. FIG. 2 shows the structure of a raw sheet 200 to be used in the multi-layered substrate. A sheet of reinforced or un-reinforced dielectric material 210 is coated on one side with a dielectric adhesive 220. The raw sheet 200 also has a thin layer of catalyst 230 at the boundary between the dielectric 210 and the adhesive 220. The arrangement of the raw sheet 200 is such that the thickness of the dielectric material 210 and the adhesive 220 are similar. The catalyst layer is thin in comparison to the thicknesses of the dielectric material 210 and the adhesive 220. Typically, the catalyst layer is less than one tenth or an order of magnitude thinner than the dielectric or adhesive. The dielectric material may be a C-stage epoxy (fully cured) and the adhesive may be a B-stage epoxy (partially cured). The catalyst may be palladium.

Figure 3:
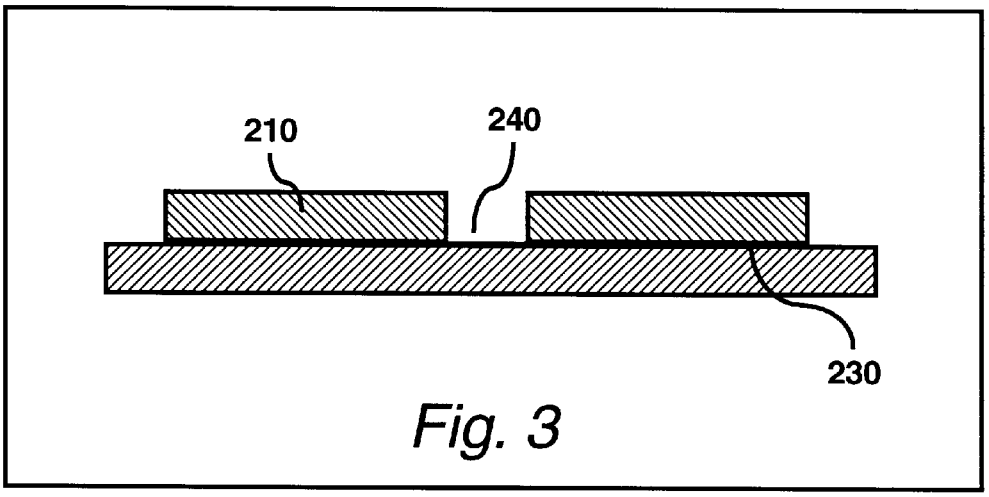
FIG. 3 is a schematic cross section of the raw material of FIG. 2 after ablation patterning.

FIG. 3 is a schematic cross section of the raw material of FIG. 2 after patterning (120) by ablation. According to the first embodiment of the invention, the patterning of the first internal layer is accomplished by selective ablation of the dielectric. The ablation process could be done with a laser and mask or by direct patterning without a mask. The purpose of this ablation is to produce trace cavities, which are enlarged at layer-to-layer interconnection points to form pad cavities 240 in the dielectric layer. This is illustrated in FIG. 3. It should be noted that the laser ablation of the dielectric 210 is conducted to such precision as to merely expose the catalyst layer 230. The first ablation stops at the catalyst layer 230 due to a sensing device associated with the laser. The different layers of material are thick enough to be discernable by the laser either by its properties of absorption or reflection. In other words, different layers have different ablation rates and the different layers are sensitive as to these different rates. The laser arrangement could employ the use of a closed loop feedback sensor that senses the presence of the catalyst layer 230. It should be noted that in areas not ablated, the original catalyst layer remains unchanged. This holds true for subsequent ablation steps.

Figure 4:
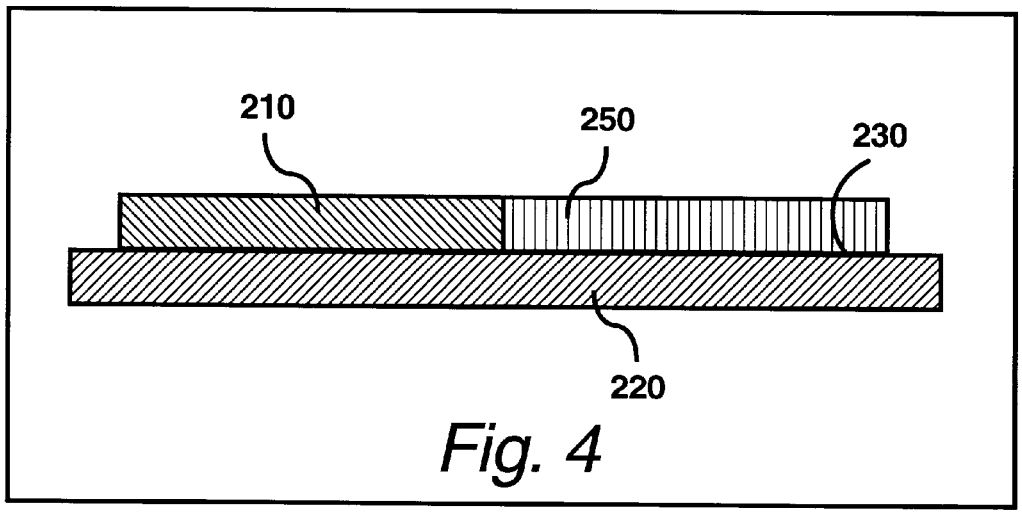
FIG. 4 is a schematic cross section of the material of FIG. 3 after metallization.

FIG. 4 is a schematic cross section of the material of FIG. 3 after metallization (130). Metallization of the first internal layer takes place after the patterning step. Metallizing involves depositing metal into the conductor cavity formed by the laser ablation. Electroless deposition is a preferred method for the deposition of metal, which is indicated as element 250. Typically, a metal or metal alloy known for its conductive properties, such as copper, is deposited into the cavity.

Figure 5:
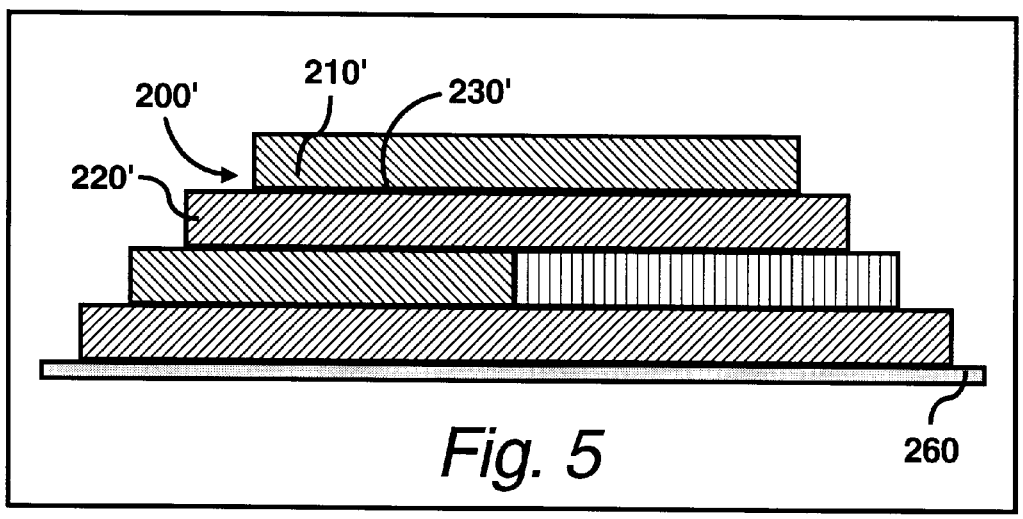
FIG. 5 is a schematic cross section of the material of FIG. 4 after a lamination of a second raw material has been performed and after the addition of a temporary release layer.

FIG. 5 is a schematic cross section showing the formation of a subsequent layer on the material of FIG. 4. This step is illustrated as 140 in FIG. 1. A second raw sheet 200' is laminated over the patterned and metallized first internal layer, thereby adding an additional layer. The heat and pressure during the lamination process liquefies the B-stage adhesive, allowing any trapped air to escape for intimate contact between first and second sheet and eventually causes the adhesive to cure (cross link) to become a C-stage dielectric. FIG. 5 also shows a temporary mold release material 260, which is also added in this initial lamination process only. This provides support and protects the bottom side of the substrate and prevents the laminate from sticking to the lamination plate used in the process.

A patterning procedure 150 follows the lamination of the subsequent layer. In this instance however, the patterning procedure is a two-step process. A laser eximer is preferably used to form the trace and pad cavities. First, a dielectric 210' is ablated exposing a catalyst layer 230'.

Figure 6:
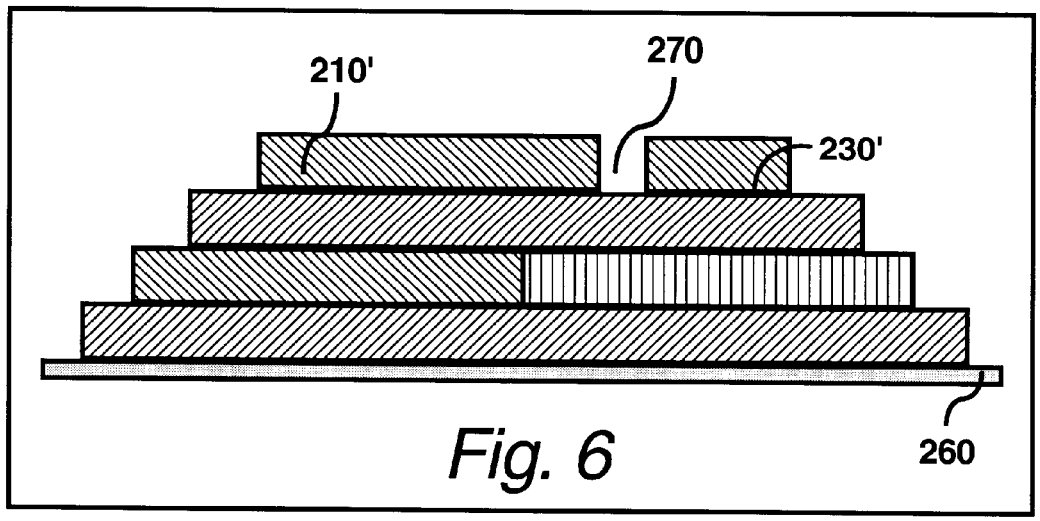
FIG. 6 is a schematic cross section of the laminated material of FIG. 5 after an ablation-patterning step has been performed.

FIG. 6 is a schematic cross section of the laminated material of FIG. 5 after an ablation-patterning step has been performed. Further patterning follows this.

Figure 7:
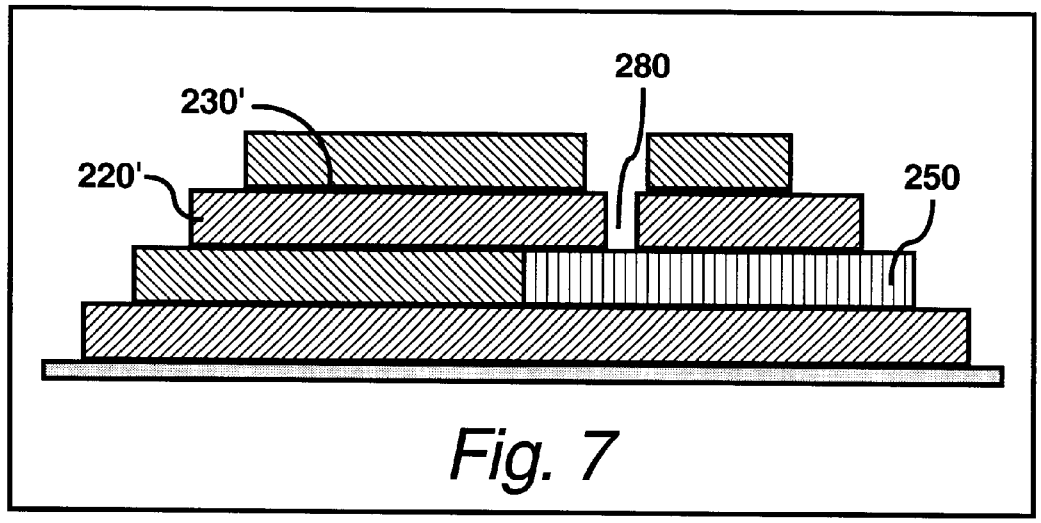
FIG. 7 is a schematic cross section of the laminated material of FIG. 6 after another ablation patterning step has been performed.

As shown in FIG. 7, a second laser ablation step is conducted, this time penetrating through the catalyst 230' and the cured adhesive layer 220', forming a via cavity 280. The ablation is done at the center of the pad cavity and is stopped at the surface of the metal deposit 250. To achieve the precision required, the laser arrangement could employ the use of a closed loop feedback sensor that senses the presence of the different layers of the substrate.

Figure 8:
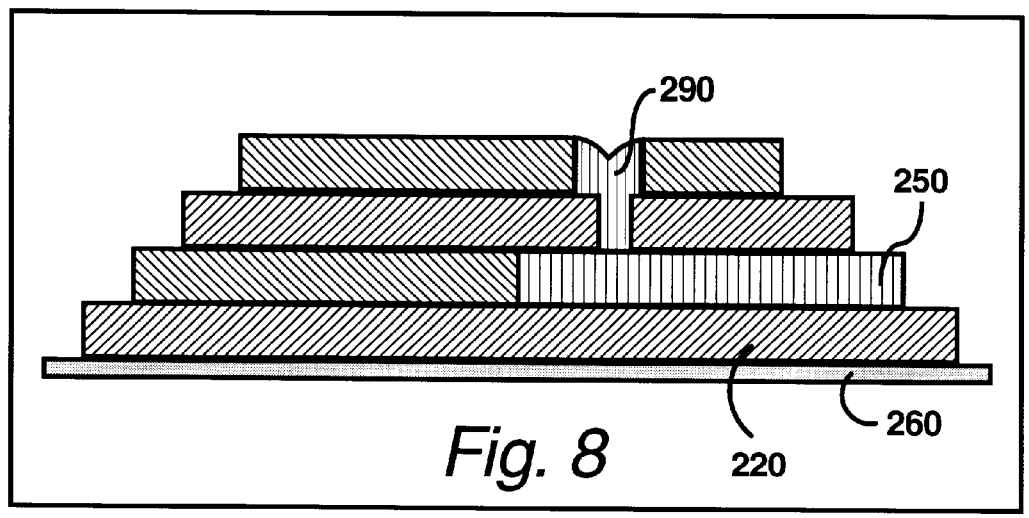
FIG. 8 is a schematic cross section of the laminated material of FIG. 7 after a metallization step.

FIG. 8 is a schematic cross section of the laminated material of FIG. 7 after a metallization step 160. Metallization of the substrate is next. This is accomplished with the electroless deposition of a metal on the exposed pad metal and the exposed catalyst. The catalyst is activated during the electroless metal deposition process. FIG. 8 shows the newly deposited metal 290. These metal deposits provide electrical interconnection between the two layers, and, a copper metal or alloy is preferably used. To increase the number of layers to a desired number, the steps illustrated in FIGS. 5–8 are repeated. In other words, the addition of subsequent layers is followed by the patterning of the subsequent layer, followed by the metallization of the subsequent layer. However, when the subsequent layers are laminated, there is no addition of a temporary release layer since the substrate already has this protective layer. The layering steps are repeated as often as required in order to get a required number of layers.

Figure 9:
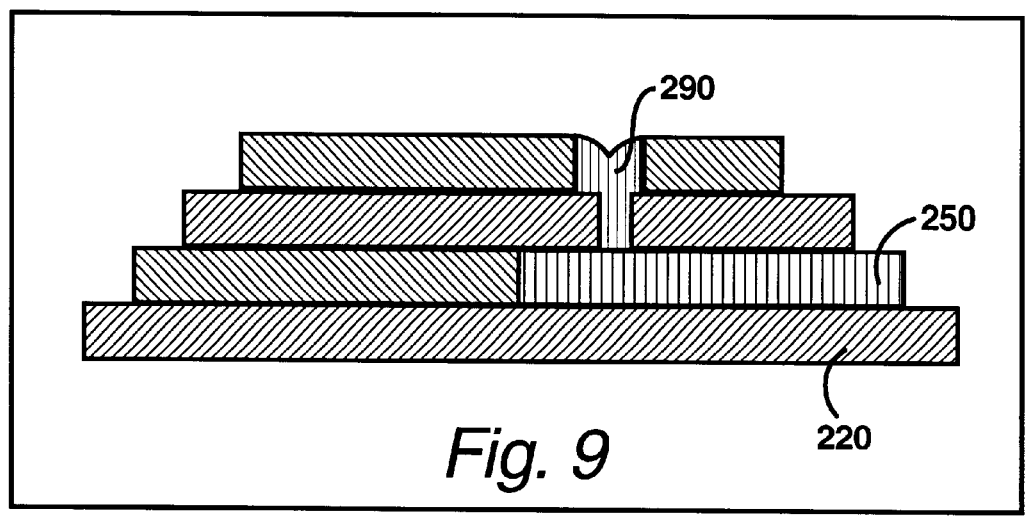
FIG. 9 is a schematic cross section of the material of FIG. 8 after the removal of the temporary support.
Figure 10:
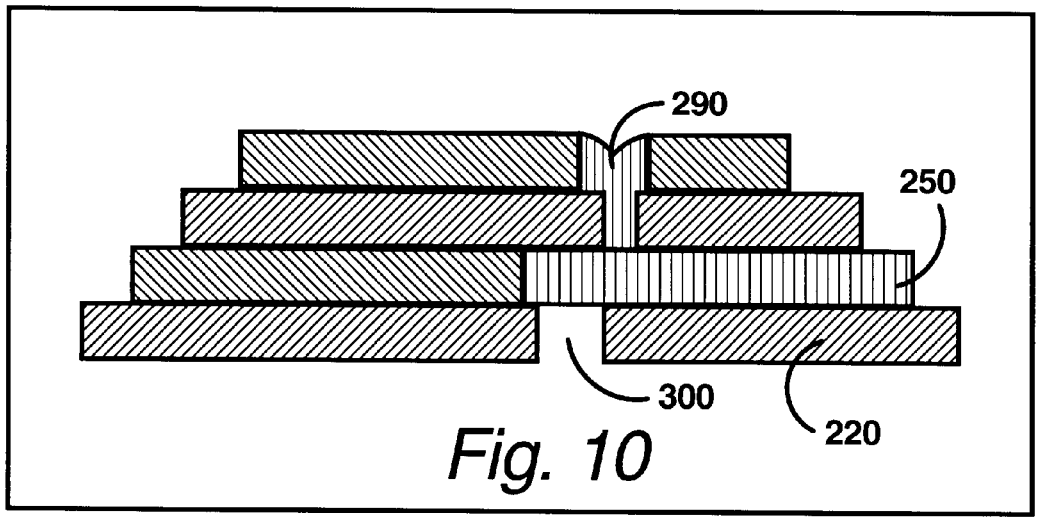
FIG. 10 is a schematic cross section of the material of FIG. 9 after final laser ablation.
Figure 11:
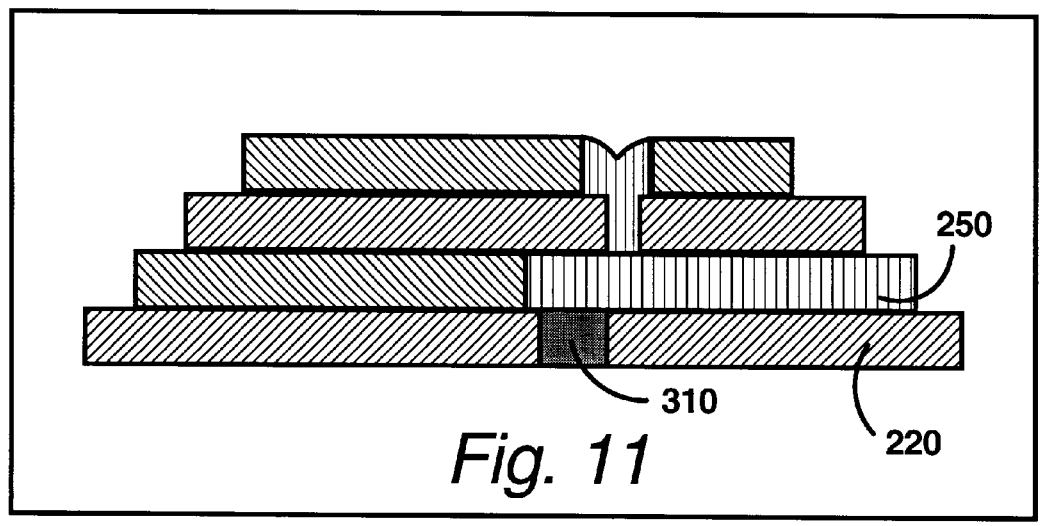
FIG. 11 is a schematic cross section of the material of FIG. 10 after optional metal deposit.

FIGS. 9–11 show the formation of bottom side access pads. After all the additional layers are metallized, the temporary mold release material 260 is removed (170) as illustrated in FIG. 9. This is followed by yet another laser ablation step 180. This time the ablation is conducted on the cured adhesive 220 of the first internal layer. The adhesive is removed and the ablation is terminated at the metal pad area 250, making this area accessible from the bottom side of the substrate. FIG. 10 shows this pad access area 300. Finally, according to this method of manufacture, an optional metal deposit is placed into this bottom side access cavity 300. FIG. 11 shows this optional metal deposit 310 as well as a multi-layered substrate according to this method.

Figure 12:
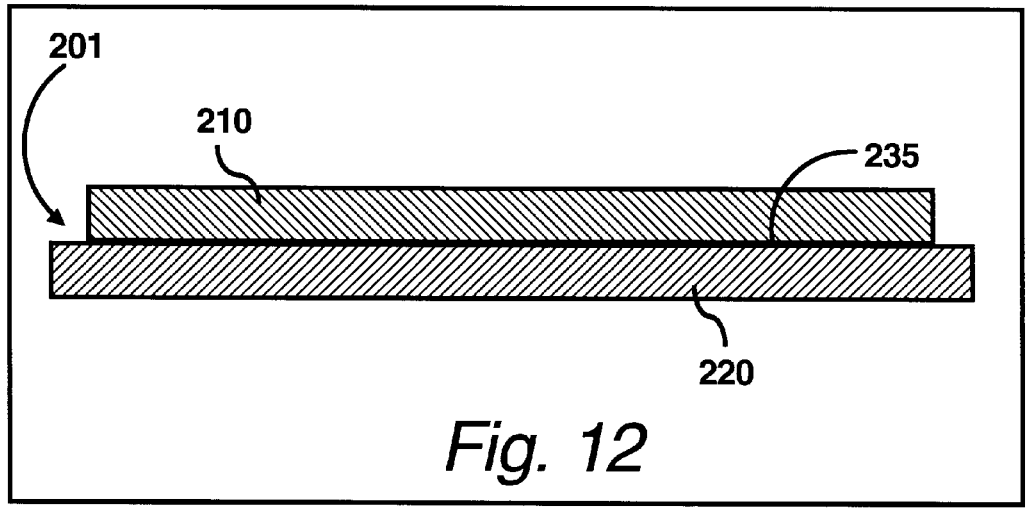
FIG. 12 is a schematic cross section of a raw sheet material with a special catalyst layer according to a second embodiment.

FIG. 12 is a schematic cross section of a raw sheet material with a special catalyst layer. This is according to second embodiment, in which a special catalyst 235 is used. The general structure of the raw material is substantially similar to the raw material illustrated in FIG. 2, except for the introduction of the special delayed-activation catalyst 235 instead of the original catalyst 230. The special catalyst 235 is different from the catalyst 230 in that it is not instantly activated during the electroless deposition process. The general steps involved in the manufacture of the substrate using this raw material 201, is the same as before. Therefore the steps for this process are outlined in the flowchart of FIG. 1. However, the metallization of the catalyst layer is delayed due to the delayed activation characteristics of the special catalyst 235.

According to this embodiment, when the electroless metal solution is introduced into the cavities, the catalyst does not get activated right away in the electroless process, but has a delayed activation in the bath. Alternatively, this could involve a separate activation step, such as a wet chemical activation step. The delayed activation according to this method ensures that the via cavity is properly filled with metal. This is especially desirable in situations where the via cavities are extremely small, resulting in poor mass transport rates. In situations like this, if the catalyst were to be activated upon immersion into the electroless bath the growing metal deposit on the catalyst layer could close the via cavity before it is entirely filed with metal.

Figure 13:
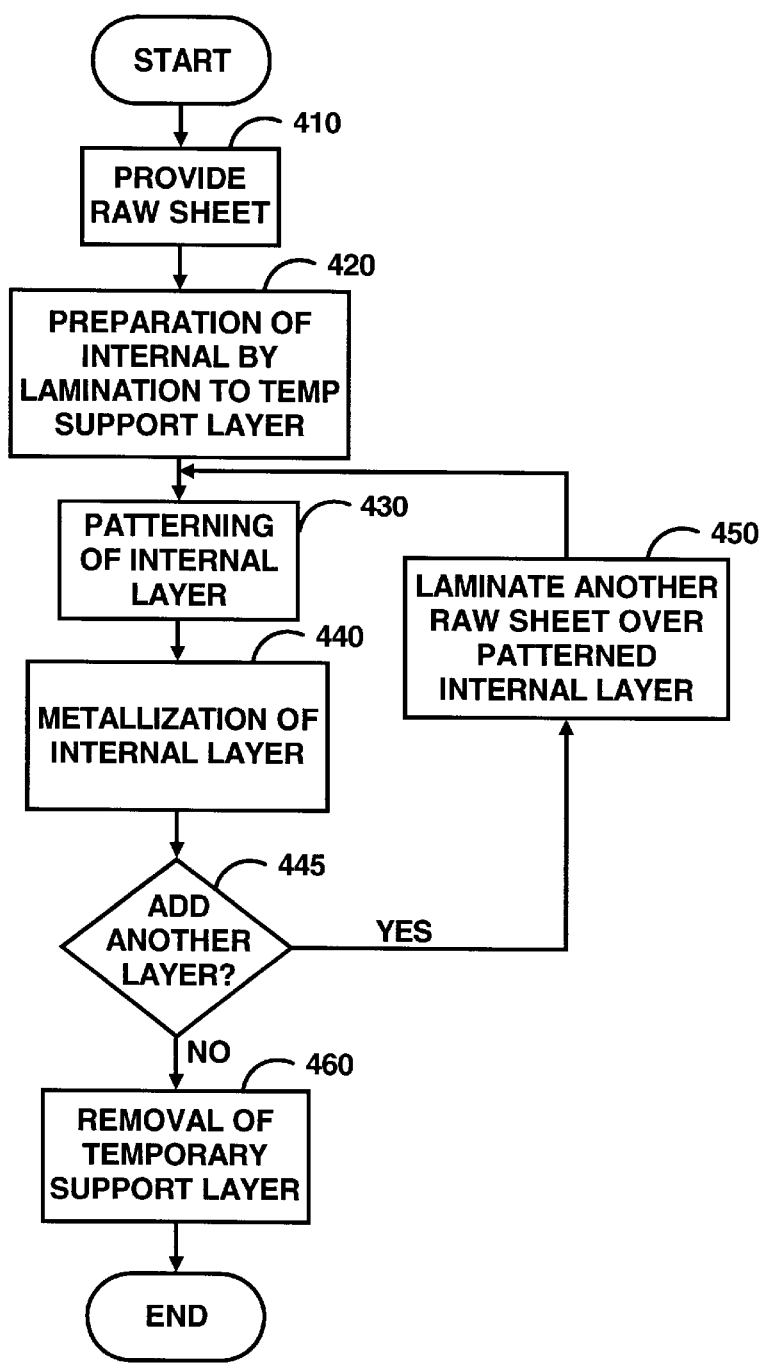
FIG. 13 is a flow chart showing the method of manufacturing according to a third embodiment.

FIG. 13 is a flow chart showing the method 400 of manufacturing according to a third embodiment. In the first step 410, the method 400 provides a raw sheet. This is followed by the step of preparing (420) a first internal layer by laminating the sheet to a temporary release layer. This prevents the laminate from sticking to lamination plates used in the process. After the first internal layer is prepared, the patterning (430) of the subsequent internal layer follows. This patterning step is followed by a metallizing step 440. In this step 440 the subsequent internal layer is metallized. At this stage a decision (445) is made, and it is decided whether another layer is required. If another layer is required, then another raw sheet is laminated over the patterned internal layer. This lamination process 450 is also illustrated in FIG. 13. This step is followed by a repeat of the patterning (430) and metallizing steps 440. Again it is decided whether another layer needs to be added. If the answer is yes, steps 450, 430, 440, and 445 are repeated. If no more layers are required, then the temporary support is removed (460), resulting in the final substrate.

As described above, FIG. 13 gives a general outline of the method 400 of manufacturing a substrate according to a third embodiment. The individual steps 410–460 are all described therein. FIGS. 14–23 illustrate more comprehensively, the step-by-step details of the method of manufacture according to this embodiment.

Figure 14:
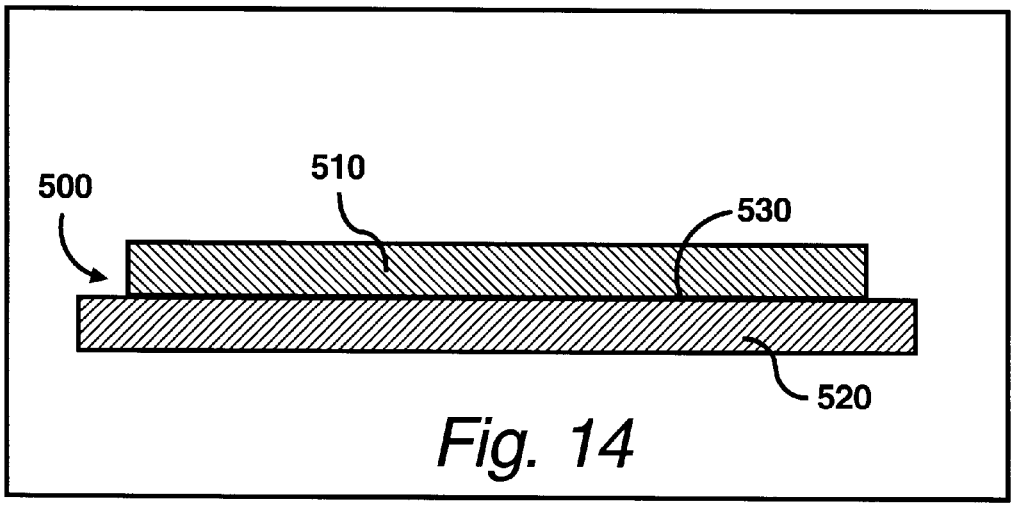
FIG. 14 is a schematic cross section of a raw sheet material according to a third embodiment.

FIG. 14 is a schematic cross section of a raw sheet material 500 according to a third embodiment. This sheet is substantially similar to the material illustrated in FIG. 2. The raw sheet 500 includes a sheet of reinforced or un-reinforced dielectric material 510. This sheet is coated on one side with a dielectric adhesive 520. The raw sheet 500 also has a thin layer of catalyst 530 at the boundary between the dielectric 510 and the adhesive 520. The arrangement of the raw sheet 500 is such that the thicknesses of the dielectric material 510 and the adhesive 520 are similar. The catalyst layer is thin in comparison to the thicknesses of the dielectric material 510 and the adhesive 520. Typically, the catalyst layer is less than one tenth or an order of magnitude thinner than the dielectric or adhesive. The dielectric material may be a C-stage epoxy (fully cured) and the adhesive may be a B-stage epoxy (partially cured). The catalyst may be palladium.

Figure 15:
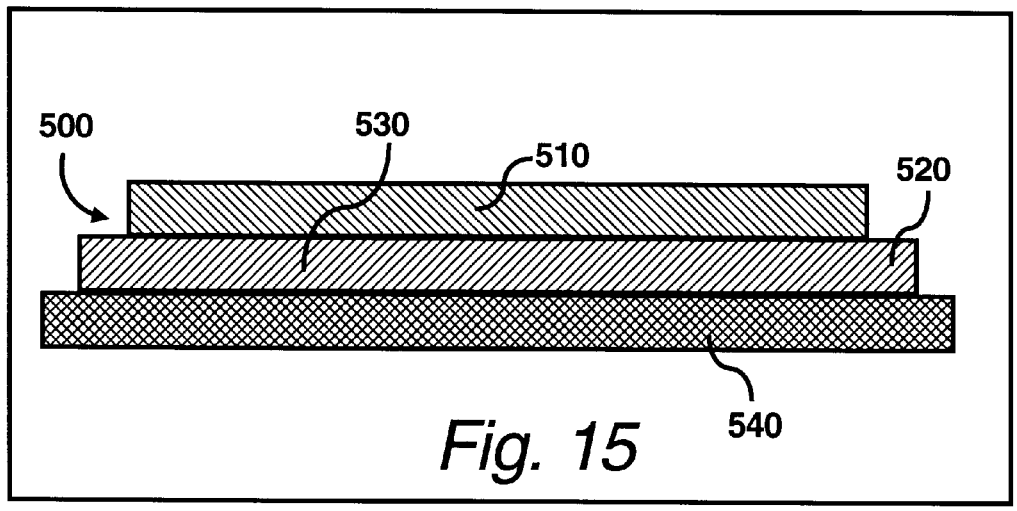
FIG. 15 is a schematic cross section of the raw material of FIG. 14 after preparation of the starting layer.

FIG. 15 is a schematic cross section of the raw material of FIG. 14 after preparation (420) of the starting layer. The preparation involves the lamination of the raw material 500 to a temporary release layer 540. The heat and pressure during the lamination process liquefies the B-stage adhesive, allowing any trapped air to escape and eventually causing the adhesive to cure (cross link) to become a C-stage dielectric. According to this method the temporary release layer 540 has a conductive surface. This conductive surface may be copper clad FR4.

According to the third embodiment of the invention, the patterning (430) of the internal layer follows. This is a two-step patterning procedure. The first step is the precision ablation of the dielectric material 510. This ablation produces trace cavities and pad cavities 550 as shown in FIG. 16.

Figure 16:
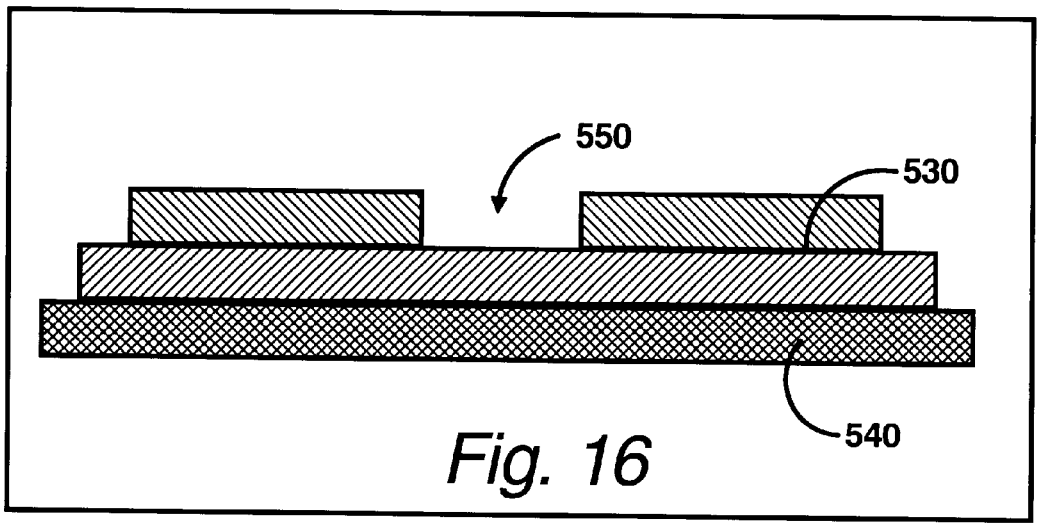
FIG. 16 is a schematic cross section of the starting layer of FIG. 15 after an ablation-patterning step.
Figure 17:
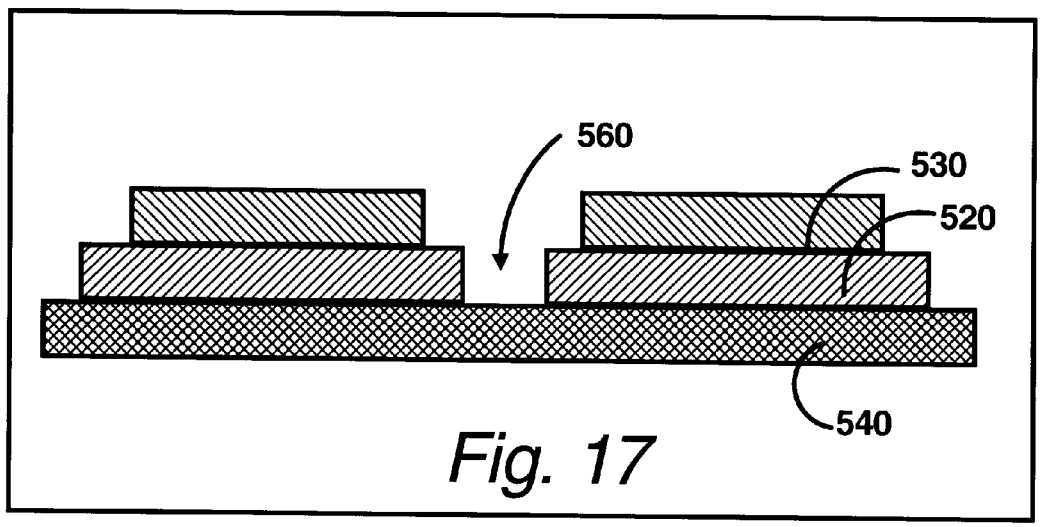
FIG. 17 is a schematic cross section of the material of FIG. 16 after a second ablation-patterning step.

FIG. 16 is a schematic cross section of the starting layer of FIG. 15 after patterning by ablation. As illustrated in this figure, the laser ablation of the dielectric is conducted to a precision so as to expose the catalyst layer 530. This is followed by the second patterning step. Again, as shown in FIG. 17, a laser ablation process is conducted through the catalyst 530 and the cured adhesive layer 520, forming a via cavity 560. The ablation process could be done with a laser and mask or by direct patterning without a mask.

FIG. 17 is a schematic cross section of the material of FIG. 16 after a second patterning by ablation step is performed. The ablation is done at the center of the pad cavity and is stopped at the metal surface of the temporary support 540. These ablation steps may be done with an eximer laser. As is the case with the first embodiment, the different layers of material are thick enough to be discernable by the laser either by its properties of absorption or reflection. The laser senses the different ablation rates to sense when it has cut through a particular layer in order to make precision cuts. It should be noted that in areas not ablated, the original catalyst layer remains unchanged. This holds true for subsequent ablation steps.

Figure 18:
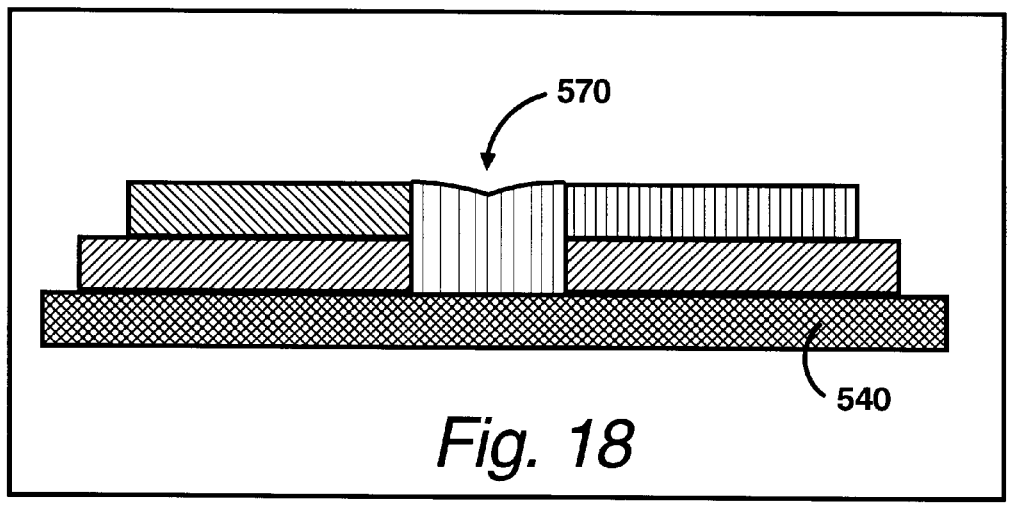
FIG. 18 is a schematic cross section of the material of FIG. 17 after a metallization step.
Figure 19:
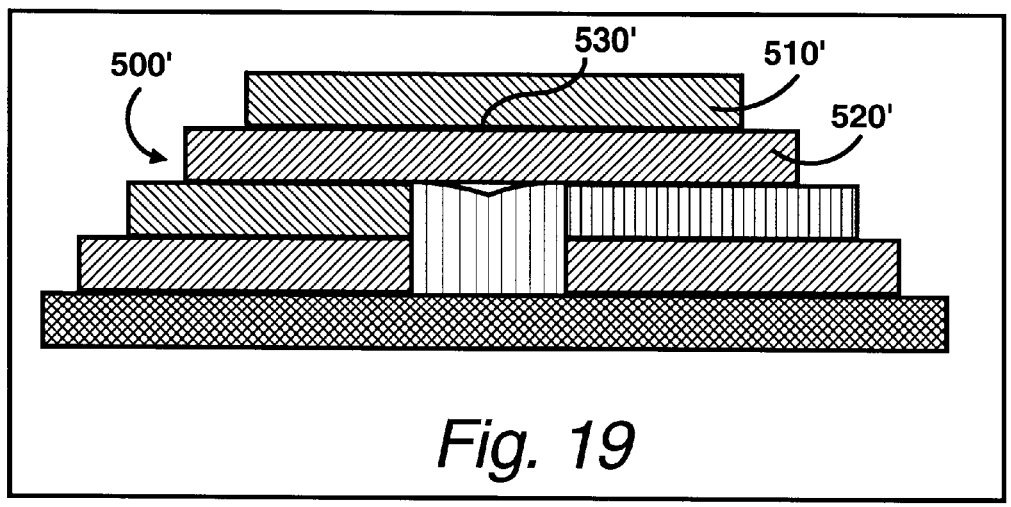
FIG. 19 is a schematic cross section of the metallized material of FIG. 18 after a second raw material has been laminated thereto.

FIG. 18 is a schematic cross section of the material of FIG. 17 after a metallization step 440. Metallization of the substrate follows the second ablation-patterning step. The metallizing is accomplished by electroless deposition of a metal on the exposed conductive surface and the activated catalyst, i.e., on the via and pad areas. FIG. 18 shows the substrate after the deposition, with the newly deposited metal 570. Typically, a metal known for the its conductive properties, such as copper or a copper alloy, is deposited into the cavity FIG. 19 is a schematic cross section of the metallized material of FIG. 18 after a second raw material has been laminated thereto. This is the next step 450 according to this embodiment, in which multiple layers are manufactured. Another raw sheet 500' is laminated over the patterned and metallized first internal layer. Again, the heat and pressure generated during the lamination process liquefies the B-stage adhesive allowing any trapped air to escape. This results in intimate contact between the sheets and eventually causes the adhesive to become a C-stage dielectric.

Figure 20:
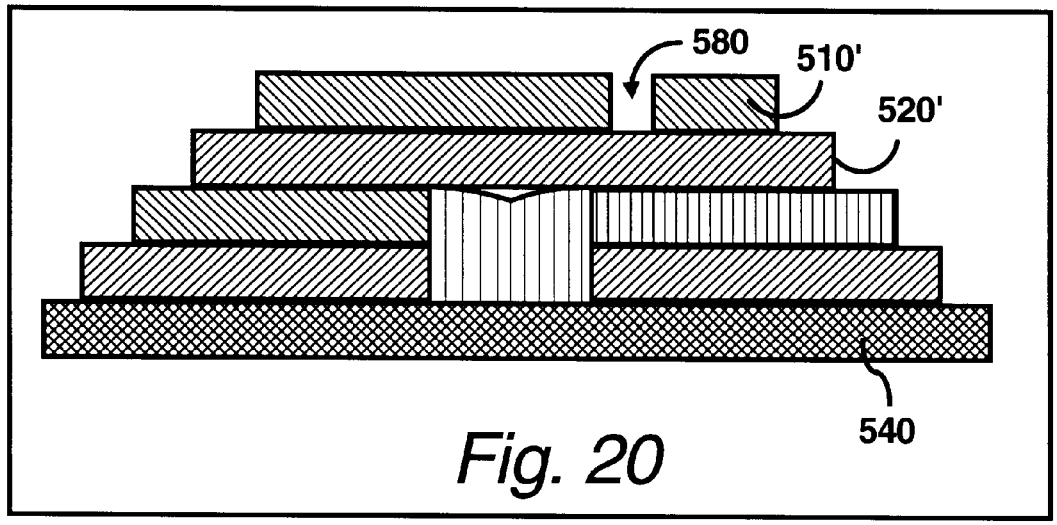
FIG. 20 is a schematic cross section of the material of FIG. 19 after an ablation-patterning step has been performed.
Figure 21:
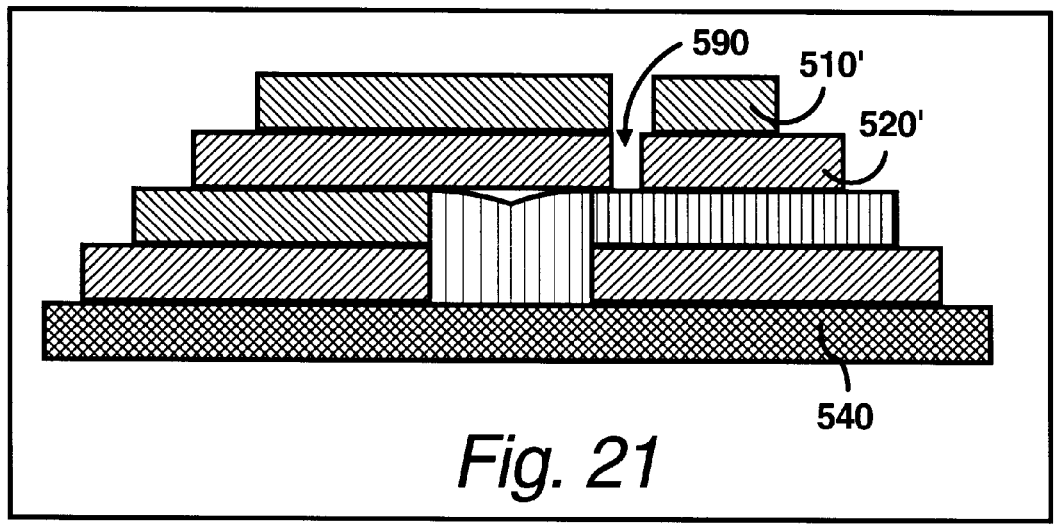
FIG. 21 is a schematic cross section of the material of FIG. 20 after another ablation patterning step has been performed.
Figure 22:
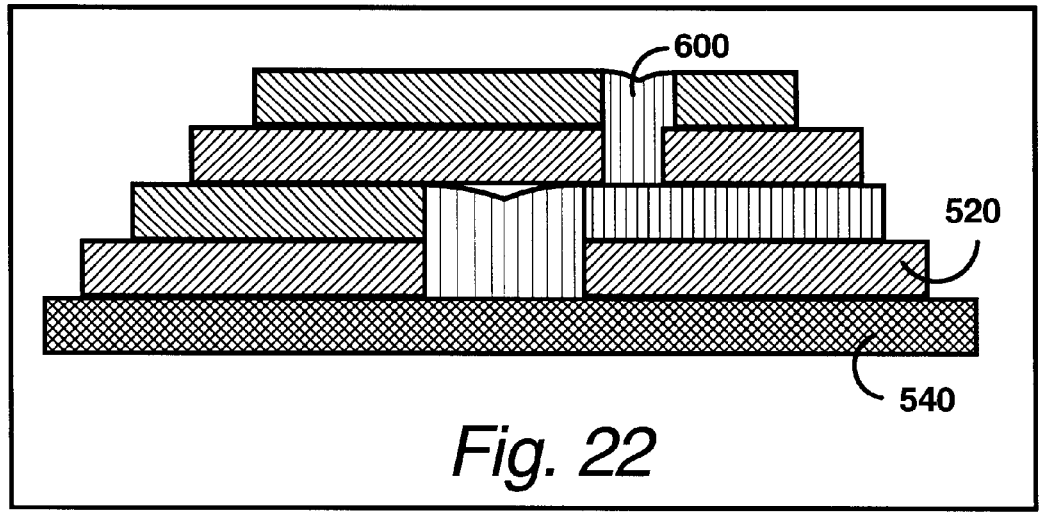
FIG. 22 is a schematic cross section of the material of FIG. 21 after a metallization step.
Figure 23:
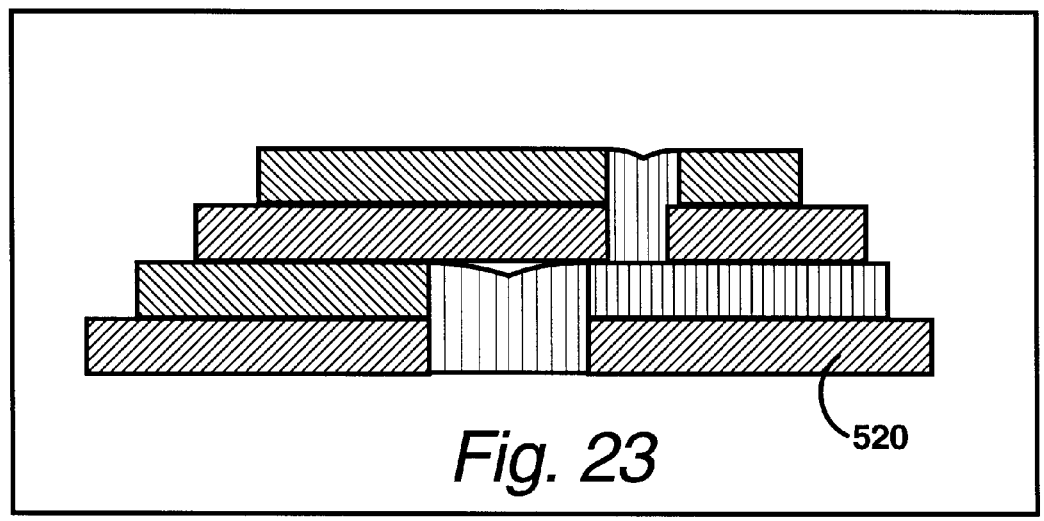
FIG. 23 is a schematic cross section of the material of FIG. 22 after the removal of the temporary support.

FIGS. 20–22 illustrate the subsequent patterning and metallizing steps. FIG. 20 shows the formation of a pad cavity 580 via eximer laser ablation. A subsequent ablation step produces a via cavity 590, as illustrated in FIG. 21. The steps illustrated in FIGS. 19–22 are repeated as often as required in order to get a desired number of layers. These steps are illustrated as steps 450, 430, and 440 respectively in FIG. 13. FIG. 23 is a schematic cross section of the material of FIG. 22 after the removal of the temporary release layer, and represents a finished product.

Figure 24:
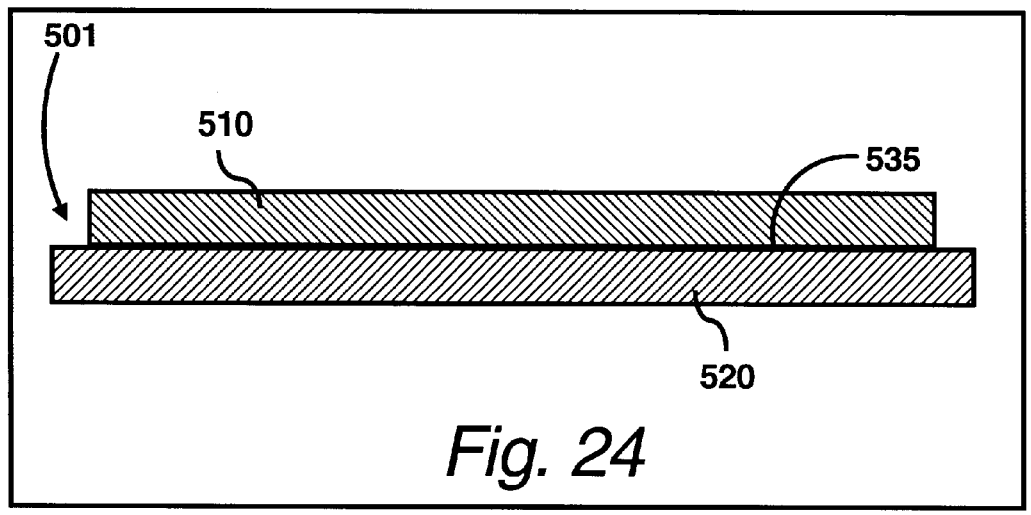
FIG. 24 is a schematic cross section of a raw sheet material with a special catalyst layer according to fourth embodiment.

FIG. 24 is a schematic cross section of a raw sheet material with a special catalyst layer. This is according to second embodiment, in which a special catalyst 535 is used. The general structure of the raw material is the same as in FIG. 13, except for the introduction of the special delayed-activation catalyst 535 instead of the original catalyst 530. The special catalyst 535 is different from the catalyst 530 of FIGS. 13–23 in that it is not instantly activated upon the introduction of the electroless solution. The steps involved in the manufacture of the substrate using this raw material 501, is the same as before. Therefore the steps for this process are outlined in the flowchart of FIG. 13. However, the metallization of the catalyst layer is delayed due to the delayed activation characteristics if the special catalyst 535.

According to this embodiment, when the electroless metal solution is introduced into the cavities, the catalyst layer does not get activated right away in the electroless process, but will have a delayed activation in the bath. Alternatively, this could involve a separate activation step, such as a wet chemical activation step. The delayed activation according to this method ensures that the via cavity is properly filled with metal. This is especially desirable in situations where the via cavities are extremely small, resulting in poor mass transport rates. In situations like this, if the catalyst were to be activated upon immersion into the electroless bath, the growing metal deposit on the catalyst layer could close the via cavity before it is entirely filled with metal.

What has been described and illustrated herein are preferred embodiments of the invention along with some variations. The terms, descriptions and figures used herein are set forth by way of illustration only and are not meant as limitations. For instance, with respect to the patterning processes outlined, other known methods may be used, such as etching or engraving etc. Also, other metals or alloys (known for their conductive properties) besides copper may be deposited into the cavities. Those skilled in the art will recognize that many variations are possible within the spirit and scope of the invention, which is intended to be defined by the following claims and their equivalents, in which all terms are meant in their broadest reasonable sense unless otherwise indicated.

What is claimed is:

1. A method of manufacturing a multi-layered substrate, said method comprising:
    providing a plurality of raw sheets;
    providing a first raw sheet of the plurality of raw sheets, said step of providing said first raw sheet comprising:
        providing a first layer of dielectric material;
        providing a first layer of catalyst on said first layer of dielectric material; and
        coating a first layer of dielectric adhesive to said first layer of dielectric material such that said first layer of catalyst is intermediate said first layer of dielectric material and said first layer of dielectric adhesive; and
    patterning said first layer of dielectric material by ablating through said first layer of dielectric material to said first layer of catalyst thereby exposing said first layer of catalyst and forming a pad cavity in said first layer of dielectric material.

2. The method as claimed in claim 1 further comprising:
    metallizing said first layer of dielectric material by electroless deposition of metal into said pad cavity to form a pad.

3. The method as claimed in claim 1 further comprising:
    providing a subsequent raw sheet of said plurality of raw sheets, said step of providing said subsequent raw sheet comprising:
        providing a subsequent layer of dielectric material;
        providing a subsequent layer of catalyst on one side of said subsequent layer of dielectric material; and
        coating a subsequent layer of dielectric adhesive to said subsequent layer of dielectric material such that said subsequent layer of catalyst is intermediate said subsequent layer of dielectric material and said subsequent layer of dielectric adhesive; and
    laminating said subsequent raw sheet over said first raw sheet.

4. The method as claimed in claim 3 further comprising:
    patterning said subsequent raw sheet, said patterning step comprising the steps of:
        ablating through said subsequent layer of dielectric material to said subsequent layer of catalyst thereby exposing said subsequent layer of catalyst; and
        ablating through said subsequent layer of catalyst and said subsequent layer of dielectric adhesive thereby exposing said pad and forming a stepped via cavity in said subsequent raw sheet; and
    metallizing said subsequent layer of dielectric material by electroless deposition of metal into said stepped via cavity.

5. The method as claimed in claim 4 further comprising the step of:
    supporting a bottom side of said first raw sheet with a temporary release layer while performing said laminating step;
    removing said temporary release layer after said step of metallizing said subsequent layer; and
    patterning said bottom side of said first raw sheet so as to form a pad access cavity.

6. The method as claimed in claim 5 further comprising the step of:
    metallizing said bottom side of said first raw sheet by electroless deposition of a metal into said pad access cavity.

7. The method as claimed in claim 6 wherein the steps of providing said catalyst layers includes providing said catalyst layers with special catalyst material having delayed-activation characteristics.

8. The method as claimed in claim 7 wherein during said metallizing steps said special catalyst material is not immediately activated but is activated in a separate wet chemical activation step.

9. A method of manufacturing a multi-layered substrate, said method comprising:
    providing a plurality of raw sheets;
    providing a first raw sheet of the plurality of raw sheets, said step of providing said first raw sheet comprising:
        providing a first layer of dielectric material;
        providing a first layer of catalyst on said first layer of dielectric material; and
        coating a first layer of dielectric adhesive to said first layer of dielectric material such that said first layer of catalyst is intermediate said first layer of dielectric material and said first layer of dielectric adhesive;
    providing a conductive temporary release layer;
    laminating said first raw sheet to said conductive temporary release layer;
    patterning said first raw sheet, said patterning step comprising:
        ablating through said first layer of dielectric material to said first layer of catalyst thereby exposing said first layer of catalyst; and
        ablating through said first layer of catalyst and said first layer of dielectric adhesive thereby exposing said conductive temporary release layer and forming a stepped via cavity in said first raw sheet; and
    metallizing said subsequent layer of dielectric material by electroless deposition of metal into said stepped via cavity.

10. The method as claimed in claim 9 further comprising:
    providing a subsequent raw sheet of said plurality of raw sheets, said step of providing said subsequent raw sheet comprising:
        providing a subsequent layer of dielectric material;
        providing a subsequent layer of catalyst on said subsequent layer of dielectric material; and
        coating a subsequent layer of dielectric adhesive to said subsequent layer of dielectric material such that said subsequent layer of catalyst is intermediate said subsequent layer of dielectric material and said subsequent layer of dielectric adhesive; and laminating said subsequent raw sheet over said first raw sheet.

11. The method as claimed in claim 10 further comprising:

patterning said subsequent raw sheet, said patterning step comprising:
ablating through said subsequent layer of dielectric material to said subsequent layer of catalyst thereby exposing said subsequent layer of catalyst; and
ablating through said subsequent layer of catalyst and said subsequent layer of dielectric adhesive thereby exposing said conductive temporary release layer and forming a stepped via cavity in said subsequent raw sheet; and metallizing said subsequent layer of dielectric material by electroless deposition of metal into said stepped via cavity.

12. The method as claimed in claim 11 further comprising:

removing said conductive temporary release layer from said first raw sheet.

13. The method as claimed in claim 12 wherein said steps of providing said catalyst layers includes providing said catalyst layers with a special catalyst having delayed-activation characteristics.

14. The method as claimed in claim 13 wherein during said metallizing steps said special catalyst is not immediately activated but is activated in a separate wet chemical activation step.

* * * * *